United States Patent
Li

(10) Patent No.: US 8,219,333 B2
(45) Date of Patent: Jul. 10, 2012

(54) BATTERY MANAGEMENT SYSTEMS FOR PROTECTING BATTERIES FROM FAULT CONDITIONS

(75) Inventor: Guoxing Li, Sunnyvale, CA (US)

(73) Assignee: O2Micro, Inc, Santa Clara, CA (US)

(*) Notice: Subject to any disclaimer, the term of this patent is extended or adjusted under 35 U.S.C. 154(b) by 0 days.

(21) Appl. No.: 12/982,003

(22) Filed: Dec. 30, 2010

(65) Prior Publication Data
US 2012/0004873 A1   Jan. 5, 2012

Related U.S. Application Data

(60) Provisional application No. 61/359,657, filed on Jun. 29, 2010.

(51) Int. Cl.
*G01R 31/36* (2006.01)
(52) U.S. Cl. ......................................................... 702/63
(58) Field of Classification Search .................... 702/63
See application file for complete search history.

(56) References Cited

U.S. PATENT DOCUMENTS

| | | | |
|---|---|---|---|
| 7,081,737 B2* | 7/2006 | Liu et al. | 320/130 |
| 7,728,552 B2* | 6/2010 | Burns | 320/116 |
| 2007/0096743 A1* | 5/2007 | Arai et al. | 324/426 |

* cited by examiner

*Primary Examiner* — Aditya Bhat

(57) ABSTRACT

A battery management system for a battery pack that includes multiple battery cells is disclosed. The battery management system includes a detector coupled to the battery cells, multiple temperature sensors coupled to the battery cells, a current sensor coupled to the battery cells in series, and a processor coupled to the current sensor. The detector generates first monitoring signals corresponding to cell voltages across the battery cells. The temperature sensors generate second monitoring signals corresponding to temperatures of the battery cells. The current sensor generates third monitoring signals corresponding to currents of the battery cells. The processor determines whether an undesired condition is present according to the first, second, and third monitoring signals.

20 Claims, 10 Drawing Sheets

BATTERY MANAGEMENT SYSTEMS FOR PROTECTING BATTERIES FROM FAULT CONDITIONS

RELATED APPLICATION

This application claims priority to U.S. Provisional Application No. 61/359,657, titled "Battery Management Systems Protecting Batteries from Fault Conditions," filed on Jun. 29, 2010, which is hereby incorporated by reference in its entirety.

BACKGROUND

Battery packs or modules that include multiple battery cells can be used in various applications, such as laptop computers, electric vehicles/hybrid electric vehicles (EVs/HEVs), and energy storage systems. During operation, a battery cell may undergo a fault condition, e.g., an over-voltage, over-current, over-temperature or cell internal micro-shorting condition, which may damage the battery cell or generate a safety issue such as an explosion or fire.

A battery management system can be used to detect cell voltages, currents and temperatures of the battery cells and perform protective actions if a fault condition occurs. However, for filtering noise, there may be a predefined delay between the occurrence of a fault condition and the detection of a fault condition by the battery management system. As a result, the protective actions may not be performed timely in response to the fault condition, and thus the battery pack may be damaged or may generate a safety issue such as an explosion or fire.

SUMMARY

A battery management system for a battery pack that includes multiple battery cells is disclosed. The battery management system includes a detector coupled to the battery cells, multiple temperature sensors coupled to the battery cells, a current sensor coupled to the battery cells in series, and a processor coupled to the current sensor. The detector generates first monitoring signals corresponding to cell voltages across the battery cells. The temperature sensors generate second monitoring signals corresponding to temperatures of the battery cells. The current sensor generates third monitoring signals corresponding to currents of the battery cells. The processor determines whether an undesired condition is present according to the first, second, and third monitoring signals.

BRIEF DESCRIPTION OF THE DRAWINGS

Features and advantages of embodiments of the subject matter will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
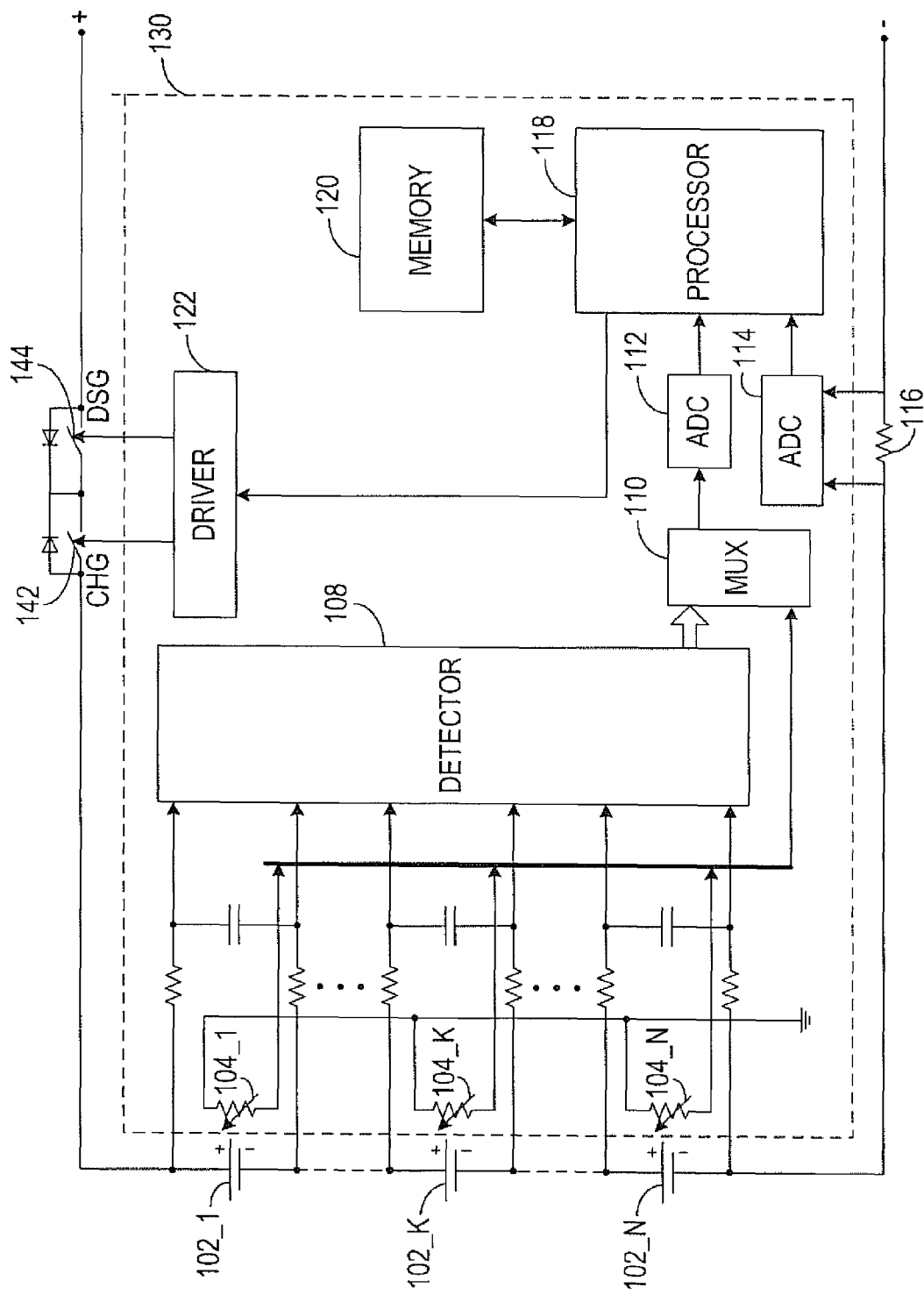
FIG. 1 illustrates a block diagram of a battery management system, in accordance with one embodiment of the present invention.

FIG. 1 illustrates a block diagram of a battery management system 130, in accordance with one embodiment of the present invention. According to embodiments of the invention, an undesired condition, e.g., a micro-shorting connection, can be detected in a battery cell according to multiple parameters of the battery cell before the undesired condition develops into a fault condition such as an over-voltage, over-current or over-temperature condition. Thus, the protection function of the battery management system 130 is improved relative to conventional designs.

As shown in the example of FIG. 1, a battery pack includes multiple battery cells 102_1-102_N. In the battery management system 130, a set of temperature sensors, e.g., thermistors 104_1-104_N coupled to the battery cells 102_1-102_N, can sense temperatures of the battery cells 102_1-102_N respectively, and can generate monitoring signals corresponding to the temperatures of the battery cells 102_1-102_N to a multiplexer 110. Furthermore, a detector 108 coupled to the battery cells 102_1-102_N can detect cell voltages across the battery cells 102_1-102_N according to potential levels measured at two terminals of the battery cells 102_1-102_N, and can generate monitoring signals corresponding to the cell voltages of the battery cells 102_1-102_N to the multiplexer 110.

In one embodiment, the multiplexer 110 sequentially transfers the monitoring signals from the detector 108 and the thermistors 104_1-104_N to a converter, e.g., an analog to digital converter (ADC) 112, which converts the monitoring signals to digital signals. The digitized signals indicating the cell voltages and temperatures of the battery cells 102_1-102_N can be provided to a processor 118, for further processing. In one embodiment, the processor 108 is a microprocessor.

Furthermore, a current sensor, e.g., a resistor 116 coupled to the battery cells 102_1-102_N in series, can provide a monitoring signal corresponding to a current flowing through the battery cells 102_1-102_N. The monitoring signal can be provided to a converter, e.g., an analog to digital converter (ADC) 114, which converts the monitoring signal to a digital signal. Thus, a digitized signal indicating the current of the battery cells 102_1-102_N can be also provided to the processor 118 for further processing.

In operation, the ADCs 112 and 114 can periodically digitize the monitoring signals and provide the digitized signals to the processor 118. By way of example, the ADCs 112 and 114 can digitize the received signals and provide the digitized signals to the processor 118 every 0.1 second.

The processor 118 can store monitoring information for the battery cells 102_1-102_N in a memory 120 and detect whether an undesired condition, e.g., a micro-shorting connection, is present in the battery cells 102_1-102_N according to the monitoring information. A micro-shorting connection is a short circuit formed inside the battery cells. A micro-shorting connection can be caused by internal contamination of the battery cells, manufacturing-induced electrode damage, burrs on electrode tabs, weld spatter from cell lead attachment points, wrinkles or kinks in windings or tabs, electrode misalignment, poorly aging electrodes, post-manufacturing mechanical damage to cells, cell thermal abuse, etc. Thus, by detecting the undesired condition, e.g., the micro-shorting connection, the battery management system 130 triggers protective actions to prevent the undesired condition from developing into a fault condition such as an over-voltage, over-current or over-temperature condition, or can issue an alert signal to a user to indicate the fault condition.

In one embodiment, a charging switch 142 and a discharging switch 144 are coupled to the battery cells 102_1-102_N in series. A driver 122 is coupled to the charging switch 142 and the discharging switch 144 to control the switches 142 and 144. In one embodiment, during a charging phase, the switch 142 is turned on and the switch 144 is turned off to enable a charging current into the battery cells. During a discharging phase, the switch 142 is turned off and the switch 144 is turned on to enable a discharging current out of the battery cells.

In operation, if the processor 118 detects the presence of an undesired condition, e.g., a micro-shorting connection, in a battery cell, the processor 118 can perform protective actions accordingly. In one embodiment, when the processor 118 detects that an undesired condition is present in a battery cell, the processor 118 informs the driver 122 to turn off the switches 142 and/or 144 to cut off a charging or discharging current flowing through the battery cell. Furthermore, the processor 118 can generate an alarm or alert signal to inform a user of the undesired condition. Additionally, other protective actions can be performed on the battery cell to prevent the battery cell from being damaged or from generating a safety issue such as an explosion or fire.

If an undesired condition, e.g., the micro-shorting connection, is present in a battery cell, multiple abnormal conditions may be present in the battery pack. The processor 118 can detect such abnormal conditions.

Detection of a first abnormal condition is described as follows. The battery pack can stay in an idle state in which the battery pack is neither charged nor discharged. When the battery pack stays in the idle state, the cell voltages of the battery cells 102_1-102_N may drop slowly because of the power dissipation on its self-loads. If the battery cells 102_1-102_N are balanced, the cell voltages and capacities of the battery cells are approximately the same. As such, the voltage drop rates of the battery cells in the idle state are approximately the same. However, if a micro-shorting connection occurs in a battery cell, the cell voltage of that battery cell may drop faster than the cell voltages of other normal battery cells.

In one embodiment, when the battery pack stays in the idle state, the processor 118 can detect whether the first abnormal condition is present by comparing a voltage drop rate of the battery cell in a current time interval with a voltage drop rate of the battery cell in a previous time interval.

More specifically, the processor 118 can calculate a voltage drop dV of a battery cell during a time interval dT(n) between the time T(n) and the time T(n−1) according to equation (1):

$$dV(n)=V(n)-V(n-1), \quad (1)$$

where V(n) represents a cell voltage of the battery cell at the time T(n) and V(n−1) represents a cell voltage of the battery cell at the previous time T(n−1). The processor 118 calculates a voltage drop rate D(n) during the time interval dT(n) according to equation (2):

$$D(n)=dV(n)/dT(n). \quad (2)$$

Furthermore, the processor 118 calculates an average $I_{AVE}(n)$ of the current flowing through the battery pack during the time interval dT(n) according to equation (3):

$$I_{AVE}(n)=(I_1+I_2+\ldots+I_K)/K, \quad (3)$$

where $I_1, I_2, \ldots,$ and $I_K$ represent the sensed currents provided by the ADC 114 during the time interval dT(n). The processor 118 further compares the average $I_{AVE}(n)$ during the time interval dT(n) with the average $I_{AVE}(n-1)$ during the previous time interval dT(n−1).

In one embodiment, if a difference between $I_{AVE}(n)$ and $I_{AVE}(n-1)$ is less than a threshold $I_E$, the processor 118 determines that the battery pack is in the idle state. If the battery pack is in the idle state, the processor 118 further compares the voltage drop rate D(n) during the time interval dT(n) with a voltage drop rate D(n−1) during a time interval dT(n−1) stored in the memory 120. In one embodiment, the time intervals dT(n) and dT(n−1) have the same duration.

If a difference between the voltage drop rate D(n) and the voltage drop rate D(n−1) is greater than a threshold $D_{TH1}$, the processor 118 can determine that a micro-shorting connection has occurred. The processor 118 can perform protective actions accordingly.

If, however, the difference between the voltage drop rate D(n) and the voltage drop rate D(n−1) is not greater than the threshold $D_{TH1}$, the processor 118 can calculate a factor MC(1) according to equation (4):

$$MC(1)=w1*NG(D(n)-D_{AVE1})/D_{TH1}, \quad (4)$$

where w1 represents a preset weight, which can be between zero to one. $D_{AVE}1$ represents an average of (N−1) voltage drop rates D(n−1), D(n−2), . . . and D(1) of the battery cell during (N−1) time intervals dT(n−1), dT(n−2), . . . and dT(1). In one embodiment, the time intervals dT(1)-dT(n) are continuous time intervals and start from the time when the battery pack enters the idle state. Additionally, the function NG(x) can be pre-defined by equation (5):

$$NG(x)=(x>0?x:0), \quad (5)$$

The function NG(x) returns x if x is positive and returns 0 if x is non-positive. The processor 118 can store the factor MC(1) in the memory 120 and can keep updating the factor MC(1) in subsequent time intervals.

Alternatively, when the battery pack stays in the idle state, the processor 118 can detect whether the first abnormal condition is present by periodically comparing a voltage drop rate of a battery cell with voltage drop rates of other battery cells during a particular time interval.

In one embodiment, the processor 118 compares the voltage drop rates of the battery cells 102_1-102_N respectively during the time intervals dT(1)-dT(n). In a time interval dT(k) ($1 \leq k \leq n$), the processor 118 identifies the maximum $D_{MAX}$ from the voltage drop rates D(k)_1-D(k)_N of the battery cells 102_1-102_N and calculates an average $D_{AVE2}$ of other voltage drop rates in the particular time interval excluding the maximum $D_{MAX}$.

In one embodiment, if a difference between $D_{MAX}$ and $D_{AVE2}$ is greater than a threshold $D_{TH2}$, the processor 118 determines that a micro-shorting connection has occurred in the battery cell having the maximum $D_{MAX}$. The processor 118 can perform protective actions accordingly. In one embodiment, the threshold $D_{TH2}$ is the same as the threshold $D_{TH1}$.

If, however, the difference between $D_{MAX}$ and $D_{AVE2}$ is not greater than the threshold $D_{TH2}$, the processor 118 can further calculate a factor MC(2) according to equation (6):

$$MC(2)=w2*NG(D_{max}-D_{AVE2})/D_{TH2}, \quad (6)$$

where w2 represents a preset weight, which can be between zero to one. Additionally, the processor 118 can store the factor MC(2) in the memory 120 and can keep updating the factor MC(2) in subsequent time intervals.

Detection of a second abnormal condition is described as follows. During a charging and discharging cycle, if a micro-shorting connection is present in a battery cell, the cell voltage of the battery cell may increase slower than the cell voltages of other normal battery cells in the charging phase and decrease faster than the cell voltages of other normal battery cells in the discharging phase. Put differently, if a micro-shorting connection is present in a battery cell, the cell voltage of the battery cell is less than the cell voltages of other normal battery cells in a charging and discharging cycle.

In one embodiment, the processor 118 periodically compares cell voltages for the battery cells to detect whether the second abnormal condition is present during a charging and discharging cycle. During the charging phase of a charging and discharging cycle, when the pack voltage of the battery pack increases to a first predetermined level, the processor 118 compares cell voltages to identify a battery cell 102_M ($1 \leq M \leq N$) with the minimum $V_{MINC}$ of the cell voltages and calculates an average $V_{AVED}$ of the cell voltages of other battery cells excluding the battery cell 102_M. During the discharging phase of the charging and discharging cycle, when the pack voltage of the battery pack decreases to a second predetermined level and if the battery cell 102_M still has the minimum $V_{MIND}$ among the battery cells 102_1-102_N, the processor 118 can calculate an average $V_{AVED}$ of the cell voltages of other battery cells excluding the battery cell 102_M.

If a difference $V_{DC}$ between $V_{AVEC}$ and $V_{MINC}$ and a difference $V_{DD}$ between $V_{AVED}$ and $V_{MIND}$ are both greater than a threshold $V_{D2}$, the processor 118 determines that a micro-shorting connection is present in the battery cell 102_M, in one embodiment. The processor 118 can perform protective actions accordingly.

If, however, the differences $V_{DC}$ and $V_{DD}$ are both less than the threshold $V_{D2}$, but are both greater than a threshold $V_{D1}$, the processor 118 can calculate a factor MC(3) according to equation (7):

$$MC(3)=w3*NG(V_{DC}+V_{DD}-2*V_{D1})/(V_{D2}-V_{D1}), \quad (7)$$

where w3 represents a preset weight, which can be between zero to one. Additionally, the processor 118 can store the factor MC(3) in the memory 120 and can keep updating the factor MC(3) in subsequent charging and discharging cycles.

Detection of a third abnormal condition is described as follows. In a charging and discharging cycle, a fully charging capacity of the battery pack after the charging phase completes is greater than a fully discharging capacity of the battery pack after the discharging phase completes because of the power consumption on self-load of the battery pack. However, if a micro-shorting connection occurs in a battery cell, a self-discharging current may increase in the battery cell, thereby decreasing the fully discharging capacity. As such, a difference between the fully charging capacity and the fully discharging capacity increases.

In one embodiment, the processor 118 compares the fully charging capacity and the fully discharging capacity of the battery pack in a charging and discharging cycle and detects whether the third abnormal condition is present in the battery pack according to the difference between the fully charging capacity and the fully discharging capacity. In a charging and discharging cycle C(n), the processor 118 can integrate the current flowing into the battery pack during the charging phase to calculate a fully charging capacity $Q_C$ of the battery pack. Similarly, the processor 118 can integrate the current flowing out of the battery pack during a discharging phase to calculate a fully discharging capacity $Q_D$ of the battery pack.

The processor 118 can further calculate a difference $Q_L(n)$ between $Q_C$ and $Q_D$ and store the difference $Q_L(n)$ in the memory 120. Moreover, the processor 118 calculates an average $Q_{L\_AVE}$ of the differences $Q_L$ obtained in previous charging and discharging cycles that are stored in the memory 120. In one embodiment, the memory 120 stores a predetermined number of differences $Q_L(n)$ obtained in the latest charging and discharging cycles.

In one embodiment, if the difference $Q_L(n)$ is greater than a threshold $Q_{TH}$, the processor 118 determines that a micro-shorting connection is present in the battery pack. The processor 118 can perform protective actions accordingly.

If, however, the difference $Q_L(n)$ is not greater than the threshold $Q_{TH}$ but greater than the average $Q_{L\_AVE}$, the processor 118 can calculate a factor MC(4) according to equation (8):

$$MC(4)=w4*NG(Q_L(n)-Q_{L\_AVE})/(V_{TH}-V_{L\_AVE}), \quad (8)$$

where w4 represents a preset weight, which can be between zero to one. Additionally, the processor 118 can store the factor MC(4) in the memory 120 and can keep updating the factor MC(4) in a subsequent charging and discharging cycle.

Detection of a fourth abnormal condition is described as follows. A micro-shorting connection may gradually form in a battery cell. Before the micro-shorting connection is completely formed, the cell voltage of the battery cell drops transiently while the charging/discharging current stays constant during a charging/discharging phase.

In one embodiment, during a charging or discharging phase, the processor 118 compares a current I(n) of the battery pack at time T(n) with a current I(n−1) of the battery pack at time T(n−1). In one embodiment, the time interval between the time T(n) and the time T(n−1) is 0.1 second. If an absolute value of a difference between the currents I(n) and I(n−1) is less than a threshold, e.g., 0.1 A, the processor 118 can further compare a cell voltage V(n) of a battery cell detected at time T(n) with a cell voltage V(n−1) of the battery cell detected at time T(n−1) to determine whether the fourth abnormal condition has occurred.

In one embodiment, if a difference dV between V(n−1) and V(n) is greater than a threshold $dV_{THR2}$, the processor 118 determines that a micro-shorting connection has occurred in the battery cell. The processor 118 can perform protective actions accordingly.

If, however, the difference dV is less than the threshold $dV_{THR2}$ but greater than a threshold $dV_{THR1}$, the processor 118 can calculate a factor MC(5) according to equation (9):

$$MC(5)=w5*NG(dV-dV_{THR1})/(dV_{THR2}-dV_{THR1}), \qquad (9)$$

where w5 represents a preset weight, which can be between zero to one. Additionally, the processor 118 can store the factor MC(5) in the memory 120 and can keep updating the factor MC(5) in the current and next charging and discharging phases.

Detection of a fifth abnormal condition is described as follows. During the charging phase, if the battery pack is charged in a constant voltage (CV) charging mode, the charging current of a battery cell gradually decreases and the cell voltage of the battery cell stays substantially constant. Under such circumstances, the internal power dissipation of the battery cell is relatively small. Alternatively, if the battery pack stays in the idle state, e.g., no charging or discharging current flows into or out of the battery pack, the power dissipation is also relatively small.

However, if a micro-shorting connection has occurred in the battery cell, an extra self-discharging current will exist in the battery cell. The extra self-discharging current is relatively high and can generate more heat. As a result, the temperature of the battery cell rises when the battery pack is charged in the CV charging mode or stays in the idle state.

In one embodiment, when the battery pack is charged in the CV charging mode or stays in the idle state, the processor 118 detects whether the fifth abnormal condition has occurred by periodically comparing a temperature of the battery cell at time T(n) with a temperature value of the battery cell at time T(n−1).

As described above, the processor 118 can periodically receive monitoring signals corresponding to the temperature of a battery cell from the ADC 112. When the battery pack is charged in the CV charging mode or stays in the idle state, the processor 118 compares the temperature Temp(n) of the battery cell at time T(n) with the temperature Temp(n−1) of the battery cell at time T(n−1).

In one embodiment, if a difference $D_{TEMP}$ between Temp(n) and Temp(n−1) is greater than a threshold Temp_th2, the processor 118 determines that a micro-shorting connection has occurred in the battery cell. The processor 118 can perform protective actions accordingly.

If, however, the difference $D_{TEMP}$ is less than the threshold Temp_th2 but greater than a threshold Temp_th1, the processor 118 can calculate a factor MC(6) according to equation (10):

$$MC(6)=w6*NG(D_{TEMP}-\text{Temp\_}th1)/(\text{Temp\_}th2-\text{Temp\_}th1), \qquad (10)$$

where w6 represents a preset weight, which can be between zero to one. Additionally, the processor 118 can store the factor MC(6) in the memory 120 and can keep updating the factor MC(6).

Alternatively, when the battery pack is charged in the CV charging mode or stays in the idle state, the processor 118 can detect whether the fifth abnormal condition has occurred, by periodically comparing a temperature variation of the battery cell during a time interval with the temperature variations of other battery cells during a particular time interval.

For example, when the battery pack is charged in the CV charging mode or stays in the idle state, the processor 118 can compare temperature variations dTemp_1-dTemp_N for the battery cells 102_1-102_N, respectively, during the particular time interval. In the current time interval dT(n), the processor 118 identifies the maximum dTemp_M (1≦M≦N) from the temperature variations dTemp_1-dTemp_N and calculates an average dTemp_ave of other temperature variations excluding the maximum dTemp_M.

In one embodiment, if a difference between dTemp_M and dTemp_ave is greater than a threshold dTemp_th, the processor 118 determines that a micro-shorting connection has occurred in the corresponding battery cell 102_M. The processor 118 can perform protective actions accordingly.

If, however, the difference between dTemp_M and dTemp_ave is less than the threshold dTemp_th, the processor 118 can calculate a factor MC(7) according to equation (11):

$$MC(7)=w7*NG(d\text{Temp\_}M-d\text{Temp\_ave})/d\text{Temp\_th}, \qquad (11)$$

where w7 represents a preset weight, which can be between zero to one. Additionally, the processor 118 can store the factor MC(7) in the memory 120 and can keep updating the factor MC(7).

In one embodiment, the processor 118 can selectively add up all or some of the factors MC(1)-MC(7) and detect an undesired condition according to the summation of those factors. In one embodiment, if the summation MC is greater than a threshold $MC_{TH}$, the processor 118 determines that an undesired condition has occurred in the battery pack. Thus, the processor 118 can performs protective actions.

Advantageously, the processor 118 can detect an undesired condition according to the variations of the voltages, currents and temperatures of the battery cells before the undesired condition develops into a fault condition such as an over-voltage, over-current or over-temperature condition. As such, the battery management system 130 can perform protective actions on the battery cell/pack to prevent the battery cell/pack from undergoing a fault condition.

Figure 2:
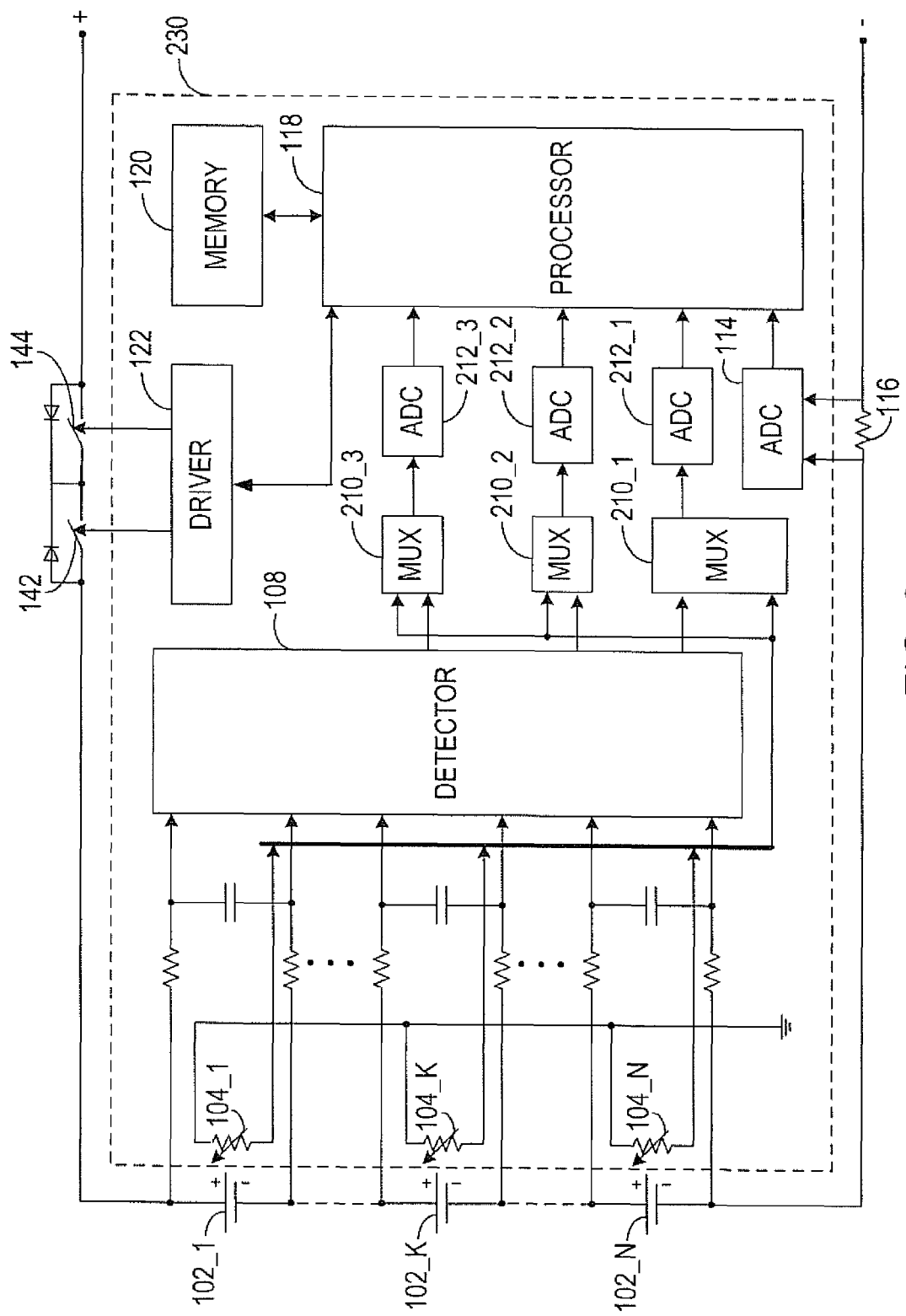
FIG. 2 illustrates a block diagram of a battery management system, in accordance with another embodiment of the present invention.

FIG. 2 illustrates a block diagram of a battery management system 230, in accordance with another embodiment of the present invention. Elements that are labeled the same as in FIG. 1 have similar functions. FIG. 2 is described in combination with FIG. 1.

As shown in the example of FIG. 2, the battery management system 230 includes multiple multiplexers, e.g., multiplexers 210_1, 210_2, and 210_3, coupled to the detector 108 and the thermistors 104_1-104_N, for transferring monitoring signals corresponding to the cell voltages and temperatures of the battery cells 102_1-102_N from the detector 108 and the thermistors 104_1-104_N to respective converters, e.g., analog to digital converters (ADCs) 212_1, 212_2 and 212_3.

In one embodiment, the battery cells 102_1-102_N can be divided into first, second and third cell groups. The detector 108 generates monitoring signals corresponding to the cell voltages of the battery cells in the first, second and third cell groups to the multiplexers 210_1, 210_2 and 210_3, respectively. Similarly, the thermistors 104_1-104_N coupled to the battery cells in the first, second and third cell groups can generate monitoring signals corresponding to the temperatures of the battery cells in the first, second and third cell groups to the multiplexers 210_1, 210_2 and 210_3, respectively. Moreover, the ADCs 212_1, 212_2 and 212_3 convert the monitoring signals of the battery cells in the first, second and third battery groups to respective digital signals, and can send the digitized signals to the processor 118 for further processing.

Advantageously, monitoring signals corresponding to the cell voltages and temperatures of the battery cells can be divided into multiple groups. The monitoring signals in each group can be transferred to a corresponding ADC sequentially via a corresponding multiplexer and converted into digital signals by the corresponding ADC. Since multiple multiplexers and ADCs can work synchronously to transfer and digitize the monitoring signals of the corresponding battery cells, the processor 118 gets monitoring information for the battery cell 102_1-102_N faster, which improves system efficiency.

Figure 3:
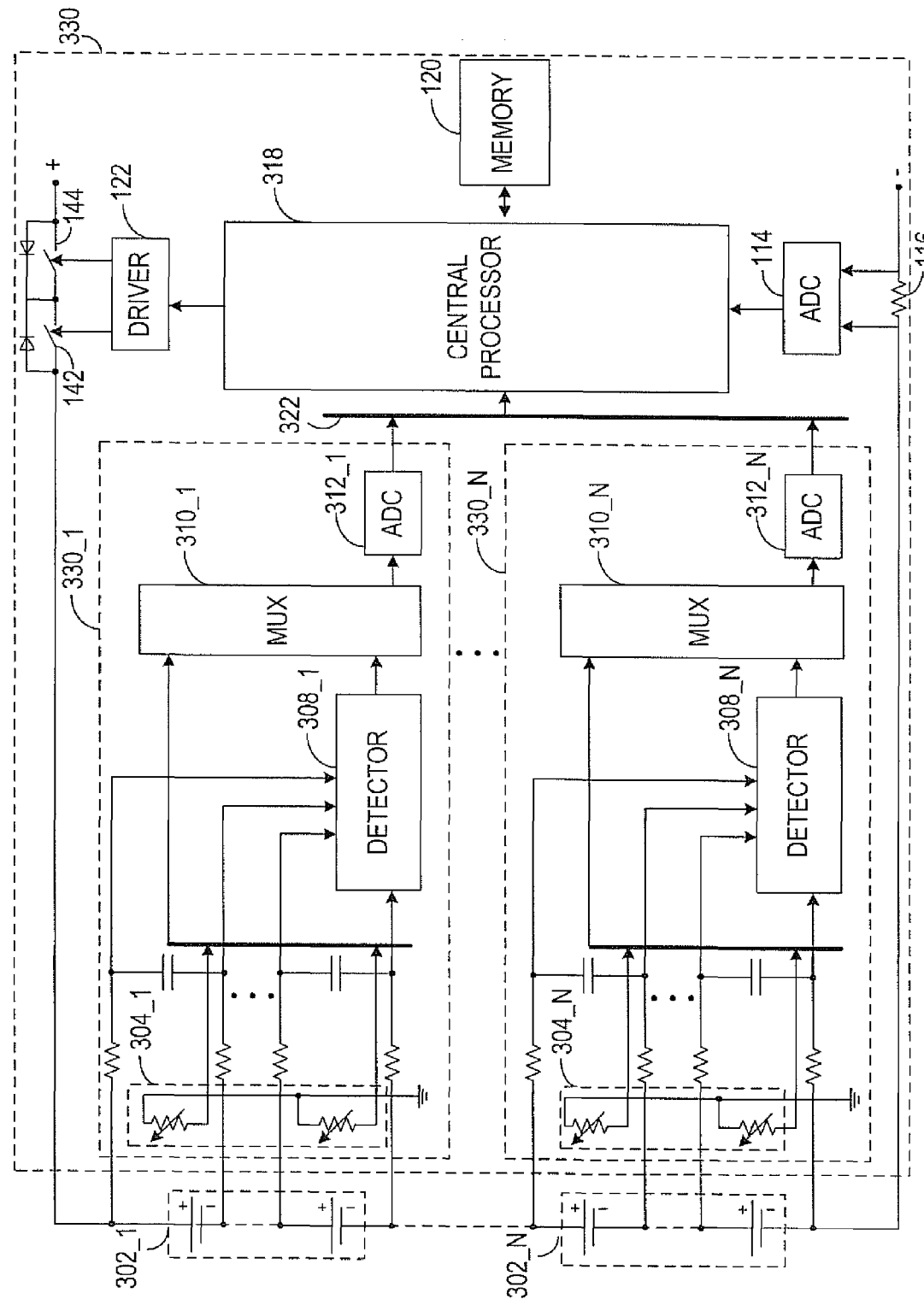
FIG. 3 illustrates a block diagram of a battery management system for managing multiple battery packs, in accordance with one embodiment of the present invention.

FIG. 3 illustrates a block diagram of a battery management system 330 for managing multiple battery packs, in accordance with one embodiment of the present invention. Elements that are labeled the same as in FIG. 1 have similar functions. FIG. 3 is described in combination with FIG. 1. In one embodiment, the battery management system 330 can have a centrally-distributed and hierarchical architecture. However, the battery management system 330 can have other configurations and is not limited to a centrally-distributed and hierarchical architecture.

In the battery management system 330, multiple local battery management systems 330_1-330_N are coupled to battery packs 302_1-302_N, respectively, to manage the corresponding battery packs. The structures and functions of the local battery management system 330_1-330_N are similar to one another. In the local battery management system 330_1, a thermistor array 304_1 including multiple thermistors senses temperatures of battery cells in the battery pack 302_1 and generates monitoring signals indicating the temperatures of the battery cells in the battery pack 302_1. Furthermore, a detector 308_1 detects cell voltages of the battery cells in the battery pack 302_1 and generates monitoring signals corresponding to the cell voltages of the battery cells in the battery pack 302_1.

Monitoring signals corresponding to the cell voltages and temperatures of the battery cells in the battery pack 302_1 are provided to a multiplexer 310_1. The multiplexer 310_1 can sequentially transfer the monitoring signals to a converter, e.g., an analog to digital converter (ADC) 312_1, which converts the monitoring signals to digital signals. Via a bus 322, the ADC 312_1 periodically sends the digitized signals which indicate the cell voltages and temperatures of the battery cells in the battery pack 302_1 to a central processor 318 for further processing. Additionally, a digitized signal indicating a current flowing through the battery packs 302_1-302_N can be periodically provided to the central processor 318 via the resistor 116 and the ADC 114 in a manner similar to that described with respect to FIG. 1.

In one embodiment, the central processor 318 functions similarly to the processor 118 in FIG. 1 such that the central processor 318 can detect the presence of an undesired condition, e.g., a micro-shorting connection, in one or more battery cells by detecting variations of the voltages and temperatures of the battery cells in the battery packs 302_1-302_N and/or by detecting variations of the current flowing through the battery packs 302_1-302_N. If the processor 318 determines that an undesired condition has occurred in one or more battery cells, the processor 318 can inform the driver 122 to turn off the switches 142 and/or 144 to cut off a charging or discharging current, generate an alarm or alert signal to inform a user of the undesired condition, and perform protective actions on the corresponding battery cell(s) to prevent the battery cell(s) from being damaged or from causing a safety issue such as an explosion or fire.

Each of the battery packs 302_1-302_N can also be treated as a single battery cell, in one embodiment. Under such circumstance, in each local battery management system 330_M ($1 \leq M \leq N$), a thermistor (not shown in FIG. 3) coupled to the battery pack 302_M can sense a temperature of the battery pack 302_M and generate a monitoring signal corresponding to the temperature of the battery pack 302_M. Furthermore, the internal detector 308_M can detect a voltage across the battery pack 302_M and generate a monitoring signal corresponding to the pack voltage of the battery pack 302_M. The monitoring signals corresponding to the pack voltage and temperature of the battery pack 302_M can be digitized by the internal ADC 312_M and then provided to the central processor 318 periodically. As such, the central processor 318 can also detect the presence of an undesired condition, e.g., a micro-shorting connection, one or more battery packs by detecting variations among the pack voltages and temperatures of the battery packs 302_1-302_N and variations among the currents flowing through the battery packs 302_1-302_N.

Figure 4:
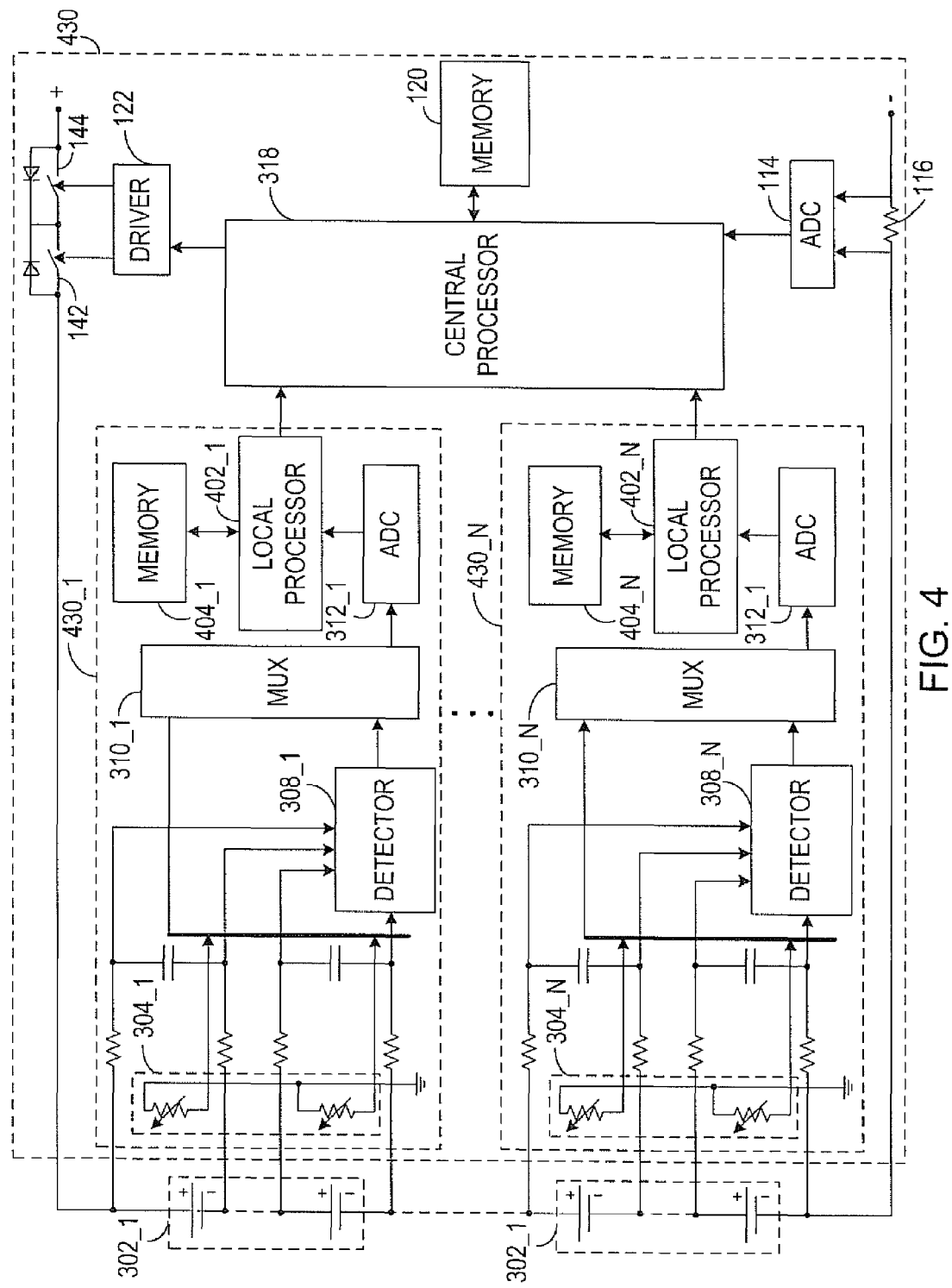
FIG. 4 illustrates a block diagram of a battery management system for managing multiple battery packs, in accordance with another embodiment of the present invention.

FIG. 4 illustrates a block diagram of a battery management system 430 for managing multiple battery packs, in accordance with another embodiment of the present invention. Elements that are labeled the same as in FIG. 1 and FIG. 3 have similar functions. FIG. 4 is described in combination with FIG. 1 and FIG. 3.

In the battery management system 430, each local battery management system 430_M ($1 \leq M \leq N$) includes a local processor 402_M and a memory 404_M. In each local battery management system 430_M, the internal ADC 312_M can periodically provide the digitized signals indicating cell voltages and temperatures of the battery cells in the battery pack 302_M into the local processor 402_M.

In one embodiment, the local processor 402_M functions in a manner similar to the processor 118 in FIG. 1. More specifically, the local processor 402_M stores received monitoring information in the memory 120 and detects whether an abnormal condition has occurred in the battery pack 302_M according to the monitoring information. The local processor 402_M also calculates the factors MC(K) according to the monitoring information upon detecting an abnormal condition. If the local processor 402_M detects that an abnormal condition has occurred in the battery pack 302_M, the local processor 402_M informs the central processor 318 about the detected abnormal condition. Additionally, the local processor 402_M sends the calculated factors MC(K) corresponding to the battery pack 302_M to the central processor 318. The local processor 402_M can also transfer the digital signals indicating cell voltages and temperatures of the battery cells in the battery pack 302_M to the central processor 318.

Advantageously, the local processor 402_1-402_N in the battery management system 430_1-430_N can help detect whether an abnormal condition has occurred in the battery packs 302_1-302_N and can calculate the factors MC(K) according to the variations of the cell voltages and temperatures of the battery cells in the battery packs 302_1-302_N, which helps lighten the workload of the central processor 318 and enhances the flexibility and efficiency of the overall system. The central processor 318 can detect whether an undesired condition has occurred in the battery packs 302_1-302_N according to the monitoring information and calculated factors MC(K) from the local processors 402_1-402_N.

Figure 5:
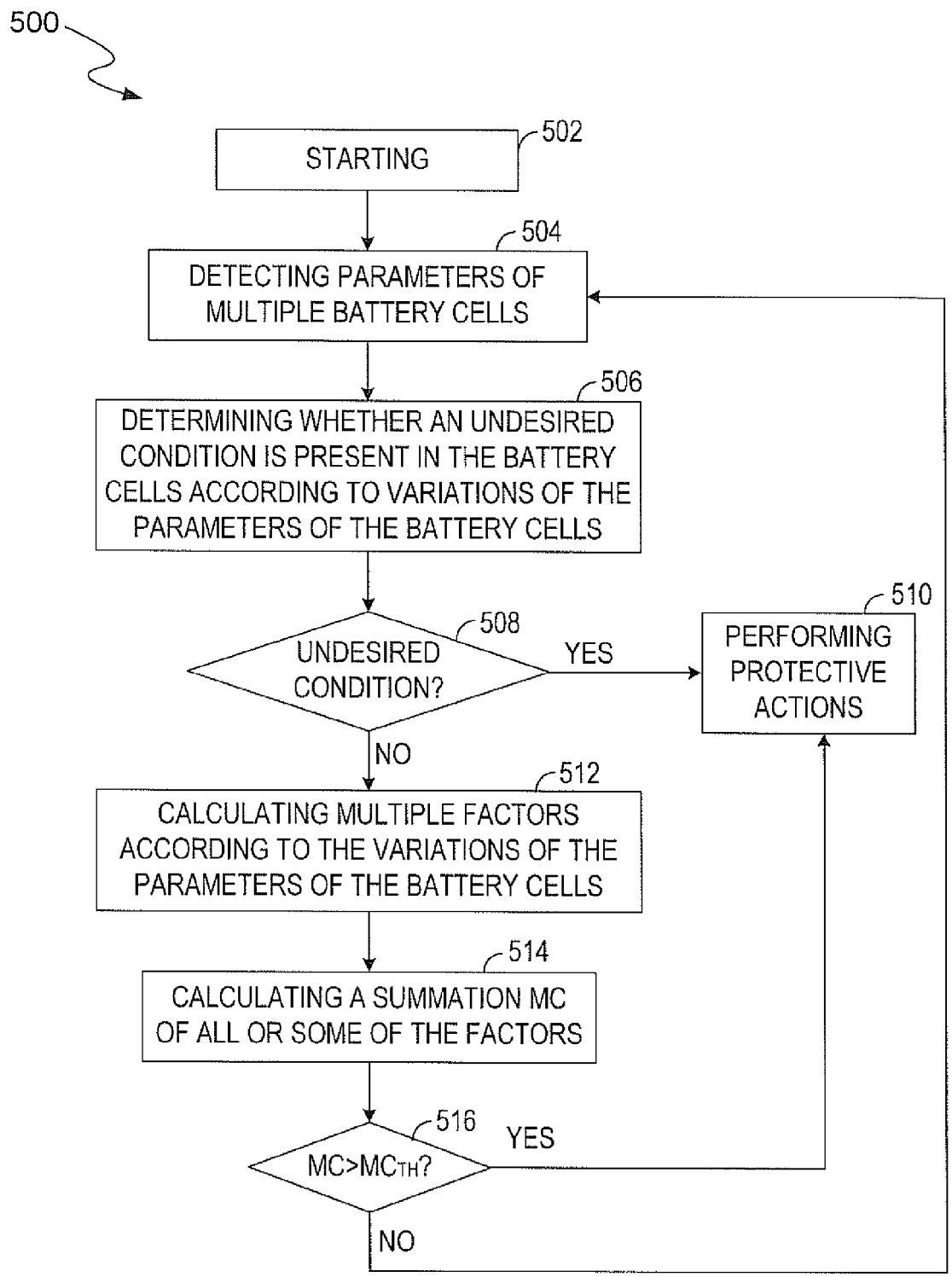
FIG. 5 illustrates a flowchart of operations performed by a battery management system, in accordance with one embodiment of the present invention.

FIG. 5 illustrates a flowchart 500 of operations performed by a battery management system, e.g., the battery management system 130 in FIG. 1, in accordance with one embodiment of the present invention. FIG. 5 is described in combination with FIG. 1.

When the battery management system 130 starts up in block 502, the battery management system 130 monitors multiple parameters including voltages, currents and temperatures of multiple battery cells in block 504. In block 506, the battery management system 130 determines whether an undesired condition, e.g., a micro-shorting connection, is present in the battery cells according to variations of selected parameters of the battery cells. In block 508, if the battery management system 130 determines that an undesired condition has occurred in a battery cell, the flowchart 500 goes to block 510. Otherwise, the flowchart 500 goes to block 512.

In block 510, the battery management system 130 performs protective actions to prevent the undesired condition from developing into a fault condition such as an over-voltage, over-current or over-temperature condition.

In block 512, the battery management system 130 calculates multiple factors MC(K) described above according to the variations of the parameters of the battery cells. In block 514, the battery management system 130 selectively adds up all or some of the factors MC(K) to calculate a summation MC of the factors. In block 514, if the summation MC is greater than a threshold $MC_{TH}$, the battery management system 130 determines that an undesired condition is present in the battery cells and the flowchart 500 goes to block 510. Otherwise, the flowchart 500 returns to block 504 to continue monitoring the parameters of the battery cells.

Figure 6:
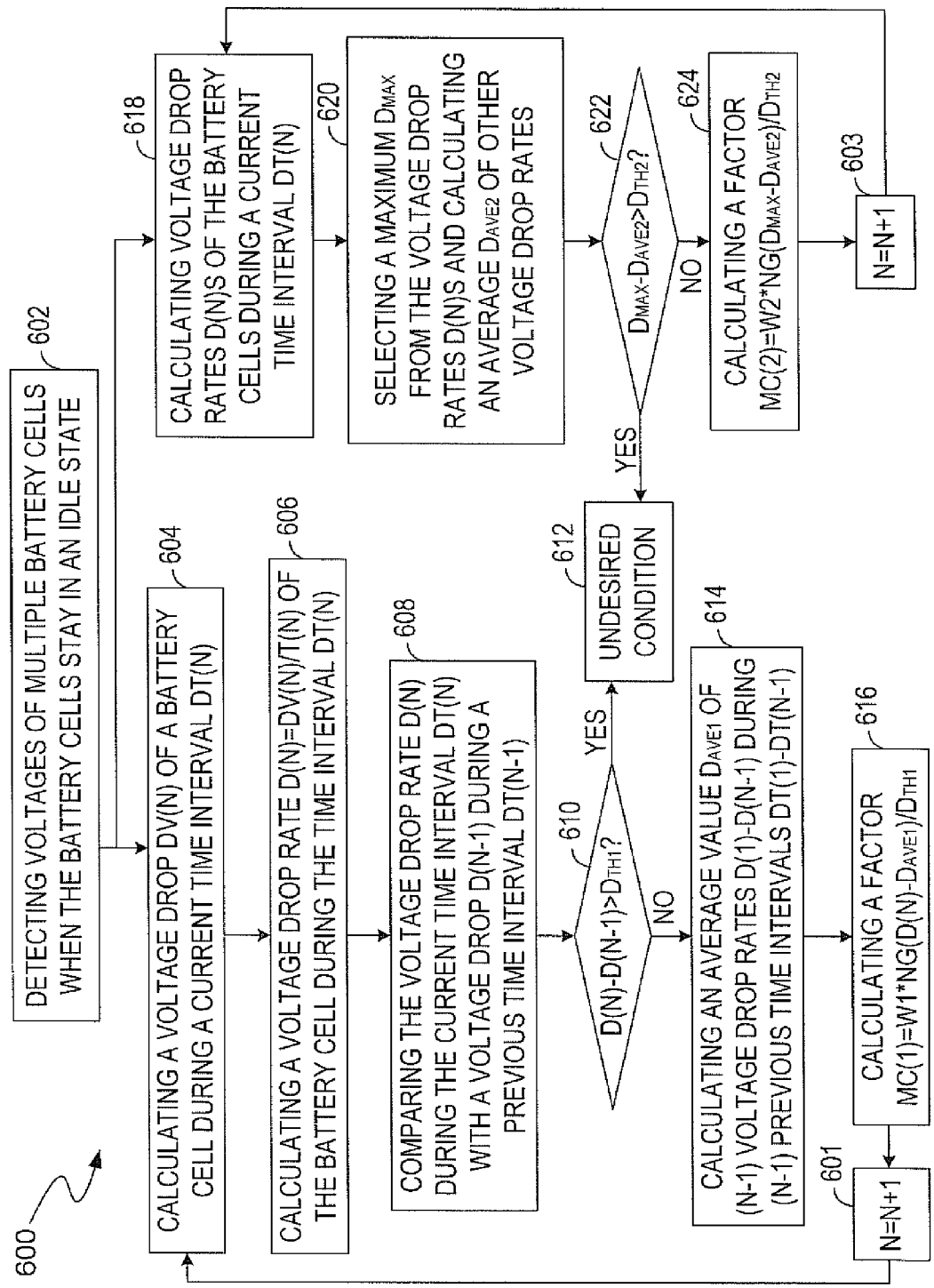
FIG. 6 illustrates a flowchart of a method for detecting the presence of an undesired condition in a battery pack, in accordance with one embodiment of the present invention.

FIG. 6 illustrates a flowchart 600 of a method for detecting the presence of an undesired condition in a battery pack, in accordance with one embodiment of the present invention. In one embodiment, the battery pack includes multiple battery cells. FIG. 6 is described in combination with FIG. 1.

In block 602, the battery management system 130 detects cell voltages of the battery cells while the battery pack stays in an idle state in which the battery pack is neither charged nor discharged. In one embodiment, the battery management system 130 can determine whether an undesired condition is present in a battery cell by comparing a voltage drop rate of the battery cell in a current time interval with a voltage drop rate of the battery cell in a previous time interval.

In block 604, the battery management system 130 calculates a voltage drop dV(n) of the battery cell during a current time interval dT(n). In block 606, the battery management 130 calculates a voltage drop rate D(n)=dV(n)/dT(n) of the battery cell during the time interval dT(n). In block 608, the battery management system 130 compares the voltage drop rate D(n) during the current time interval dT(n) with a voltage drop rate D(n−1) during a previous time interval dT(n−1).

In block 610, if a difference between D(n) and D(n−1) is greater than a threshold $D_{TH1}$, the battery management system 130 determines that an undesired condition has occurred in the battery cell in block 612. If the difference between D(n) and D(n−1) is not greater than the threshold $D_{TH1}$ in block 610, the battery management system 130 calculates an average $D_{AVE1}$ of (n−1) voltage drop rates D(1)-D(n−1) during (n−1) previous time intervals dT(1)-dT(n−1) in block 614. In block 616, the battery management system 130 calculates the factor MC(1) according to equation (4):

$$MC(1)=w1*NG(D(n)-D_{AVE1})/D_{TH1}. \quad (4)$$

After n is incremented by 1 in block 601, the flowchart 600 returns to block 604 to calculate a voltage drop dV(n) of the battery cell during a subsequent time interval dT(n).

In another embodiment, the battery management system 130 can detect whether an undesired condition is present in a battery cell by comparing a voltage drop rate of the battery cell with voltage drop rates of other battery cells during the same time interval.

More specifically, in block 618, the battery management system 130 calculates voltage drop rates D(n)s of the battery cells during a current time interval dT(n). In block 620, the battery management system 130 identifies the maximum $D_{MAX}$ for the voltage drop rates D(n)s and calculates an average $D_{AVE2}$ of other voltage drop rates excluding $D_{MAX}$.

In block 622, if a difference between $D_{MAX}$ and $D_{AVE2}$ is greater than a threshold $D_{TH2}$, the battery management system 130 determines that an undesired condition has occurred in the battery cell in block 612. Otherwise, the flowchart 600 goes to block 622. In block 622, the battery management system 130 calculates the factor MC(2) according to equation (6):

$$MC(2)=w2*NG(D_{MAX}-D_{AVE2})/D_{TH2}. \quad (6)$$

After n is incremented by 1 in block 603, the flowchart 600 returns to block 618 to calculate voltage drop rates D(n)s of the battery cells during a subsequent time interval dT(n).

Figure 7:
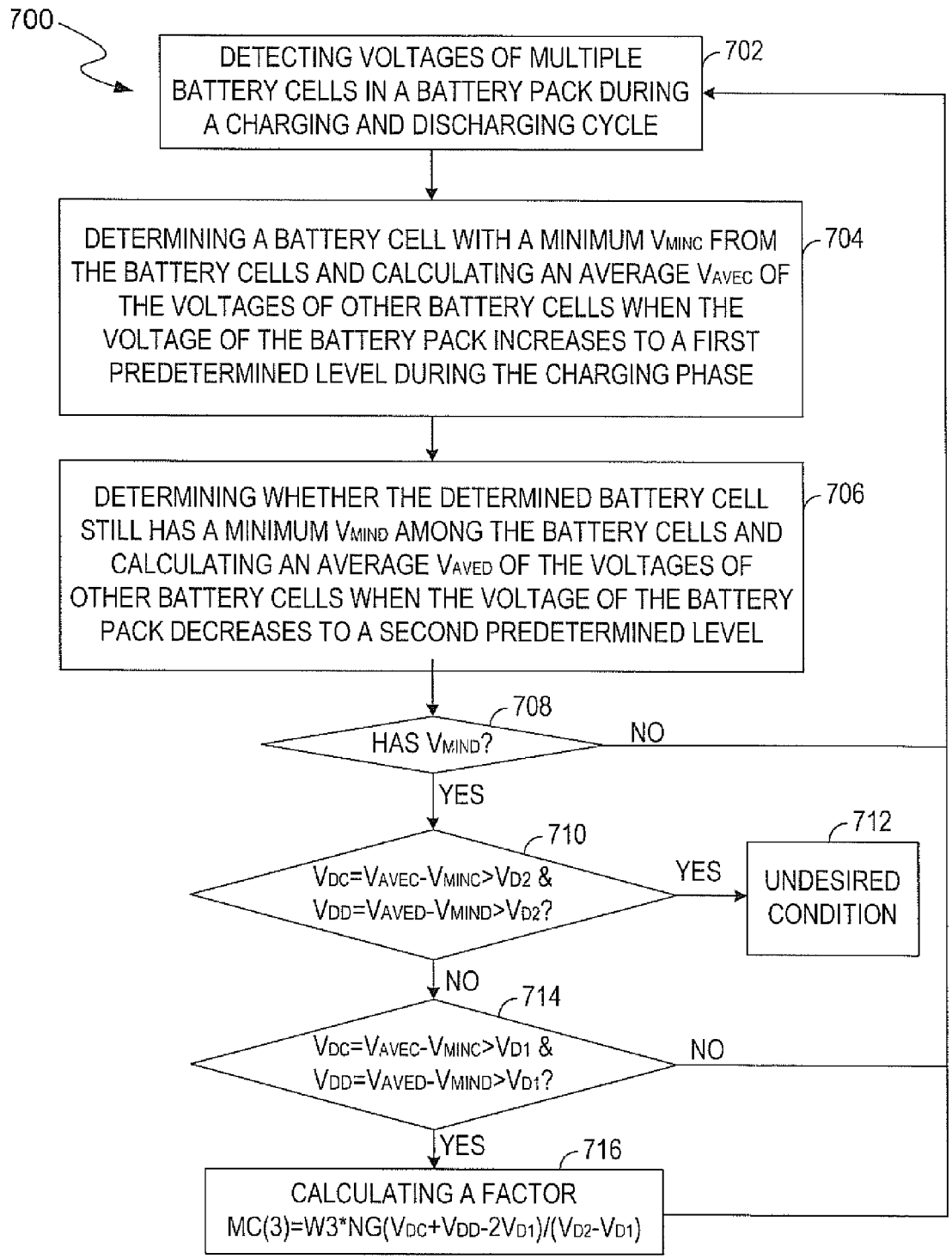
FIG. 7 illustrates a flowchart of a method for detecting the presence of an undesired condition in a battery pack, in accordance with one embodiment of the present invention.

FIG. 7 illustrates a flowchart 700 of a method for detecting the presence of an undesired condition in a battery pack, in accordance with one embodiment of the present invention. In one embodiment, the battery pack includes multiple battery cells. FIG. 7 is described in combination with FIG. 1.

In block 702, the battery management system 130 detects cell voltages of the battery cells during a charging and discharging cycle. In block 704, the battery management system 130 identifies a battery cell M with the minimum $V_{MIND}$ relative to other battery cells, and calculates an average $V_{AVEC}$ of the cell voltages of other battery cells excluding the cell M when the pack voltage of the battery pack increases to a first predetermined level during the charging phase. In block 706, the battery management system 130 determines whether the battery cell M still has the minimum $V_{MIND}$ relative to the battery cells, and calculates an average $V_{AVED}$ of the cell voltages of other battery cells excluding the cell M when the pack voltage of the battery pack decreases to a second predetermined level.

In block 708, if the battery cell M still has the minimum $V_{MIND}$ relative to other battery cells, the flowchart 700 goes to block 710. Otherwise, the flowchart 700 returns to block 702.

In block 710, if a difference $V_{DC}$ between $V_{AVEC}$ and $V_{MINC}$ and a difference $V_{DD}$ between $V_{AVED}$ and $V_{MIND}$ are both greater than a threshold $V_{D2}$, the battery management system 130 determines that an undesired condition has occurred in the battery cell in block 712. Otherwise, the flowchart 700 goes to block 714. In block 714, if the differences $V_{DC}$ and $V_{DD}$ are both greater than a threshold $V_{D1}$, the flowchart 700 goes to block 716. Otherwise, the flowchart 700 returns to block 702.

In block 716, the battery management system 130 calculates the factor MC(3) according to equation (7):

$$MC(3)=w3*NG(V_{DC}+V_{DD}-2*V_{D1})/(V_{D2}-V_{D1}). \quad (7)$$

Then the flowchart 700 returns to block 702 to detect cell voltages of the battery cells during a subsequent charging and discharging cycle.

Figure 8:
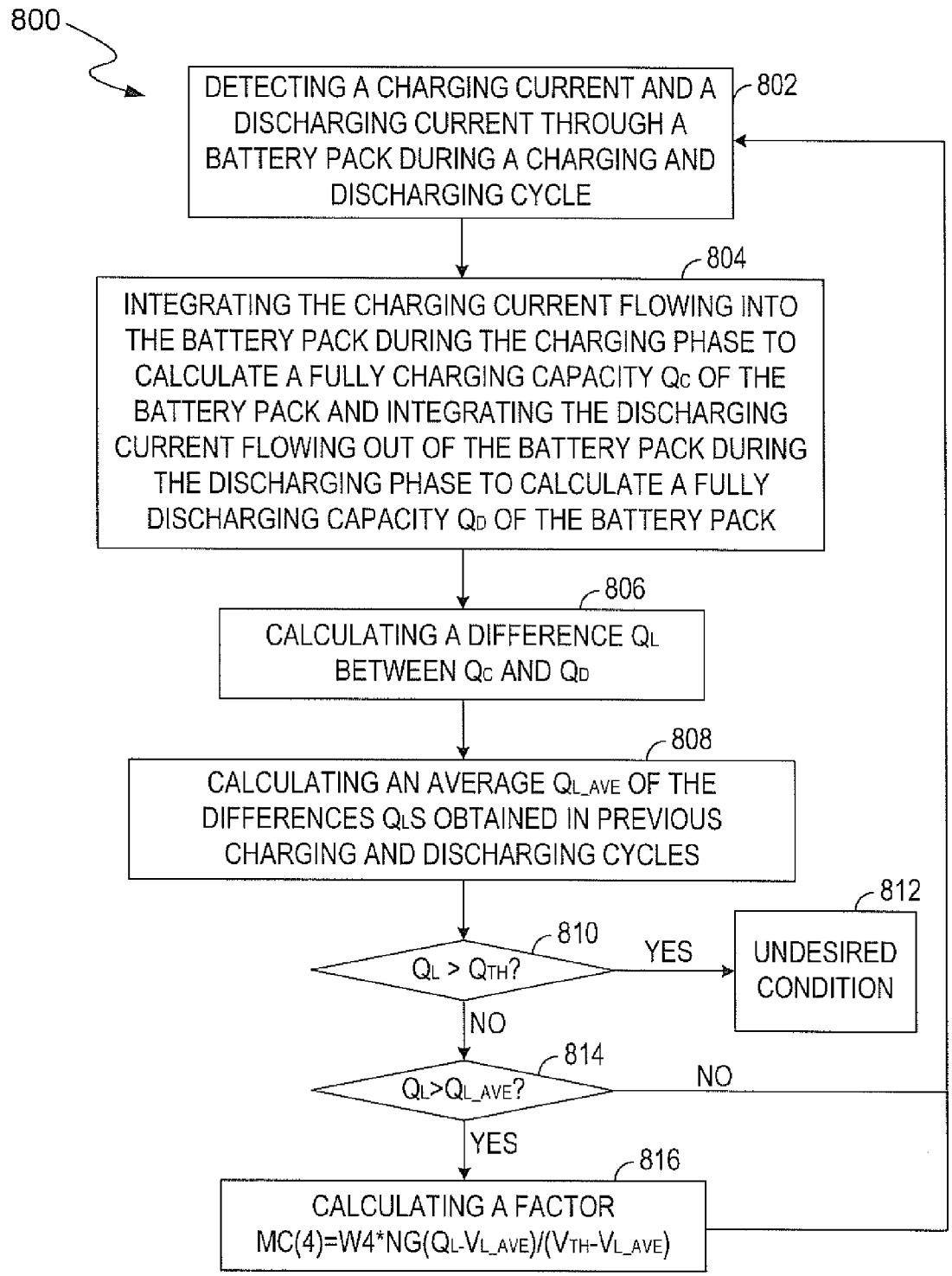
FIG. 8 illustrates a flowchart of a method for detecting the presence of an undesired condition in a battery pack, in accordance with one embodiment of the present invention.

FIG. 8 illustrates a flowchart 800 of a method for detecting the presence of an undesired condition in a battery pack, in accordance with one embodiment of the present invention. FIG. 8 is described in combination with FIG. 1.

In block 802, the battery management system 130 detects a charging current and a discharging current through a battery pack during a charging and discharging cycle. In block 804, the battery management system 130 integrates the charging current flowing into the battery pack during the charging phase to calculate a fully charging capacity $Q_C$ of the battery pack, and integrates the discharging current flowing out of the battery pack during the discharging phase to calculate a fully discharging capacity $Q_D$ of the battery pack.

In block 806, the battery management system 130 calculates a difference $Q_L$ between $Q_C$ and $Q_D$ in the current charging and discharging cycle. In block 808, the battery management system 130 calculates an average $Q_{L\_AVE}$ of the differences $Q_L$s obtained in previous charging and discharging cycles. In block 810, if the difference $Q_L$ is greater than a threshold $Q_{TH}$, the battery management system 130 determines that an undesired condition has occurred in the battery pack in block 812. Otherwise, the flowchart 800 goes to block 814.

In block 814, if the difference $Q_L$ is greater than the average $Q_{L\_AVE}$, the flowchart 800 goes to block 816. Otherwise, the flowchart 800 returns to block 802. In block 816, the battery management system 130 calculates the factor MC(4) according to equation (8):

$$MC(4)=w4*NG(Q_L-Q_{L\_AVE})/(V_{TH}-V_{L\_AVE}) \quad (8)$$

Then the flowchart 800 returns to block 802 to detect a charging current and a discharging current flowing through the battery pack during a subsequent charging and discharging cycle.

Figure 9:
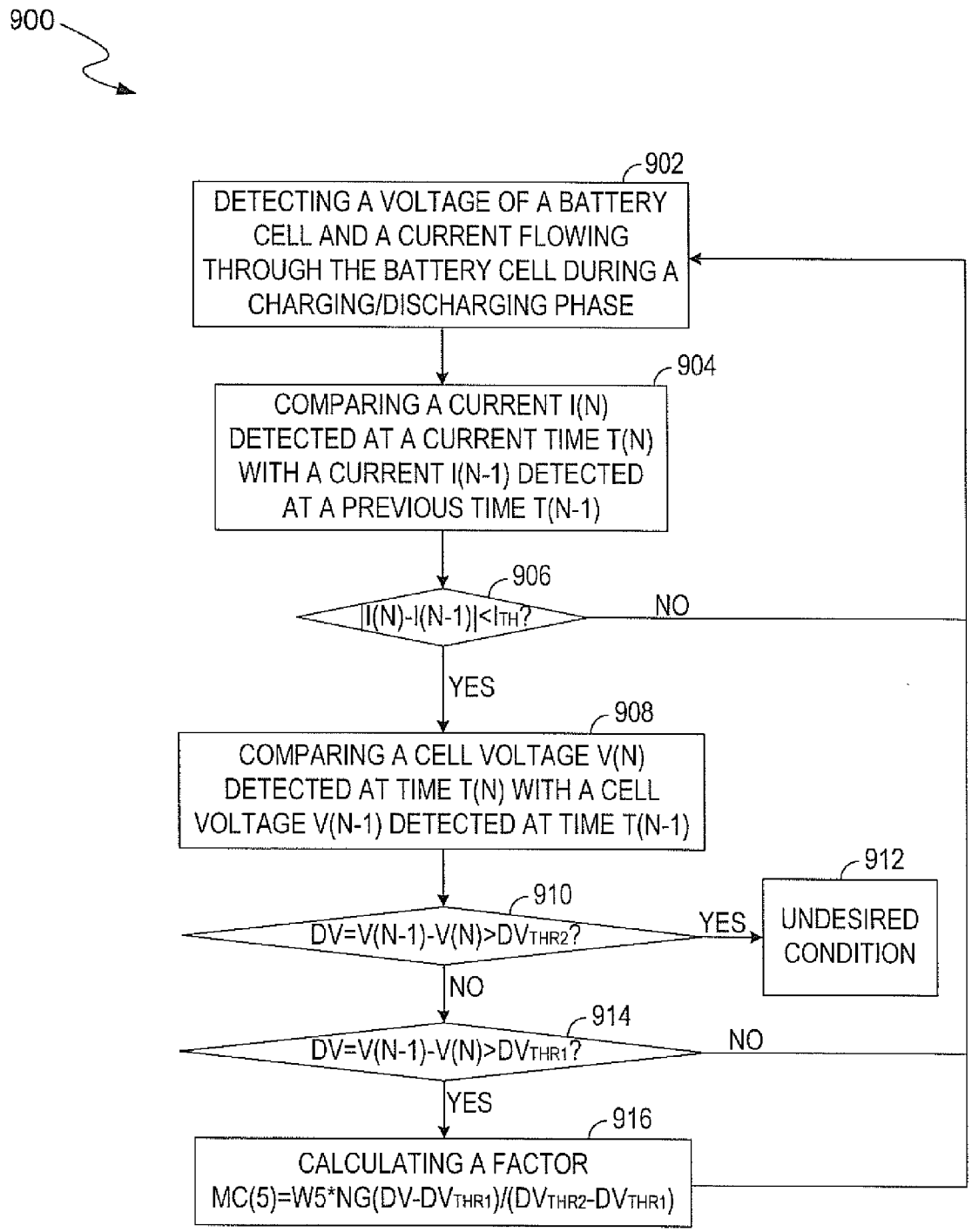
FIG. 9 illustrates a flowchart of a method for detecting the presence of an undesired condition in a battery pack, in accordance with one embodiment of the present invention.

FIG. 9 illustrates a flowchart 900 of a method for detecting the presence of an undesired condition in a battery pack, in accordance with one embodiment of the present invention. In one embodiment, the battery pack includes multiple battery cells. FIG. 9 is described in combination with FIG. 1.

In block 902, the battery management system 130 detects a voltage of a battery cell and a current flowing through the battery cell during a charging/discharging phase. In block 904, the battery management system 130 compares a current I(n) of the battery cell detected at a current time T(n) with a current I(n−1) of the battery cell detected at a previous time T(n−1). In block 906, if an absolute value of a difference between I(n) and I(n−1) is less than a threshold $I_{TH}$, e.g., 0.1 A, the flowchart 900 goes to block 908. Otherwise, the flowchart 900 returns to block 902.

In block 908, the battery management system 130 compares a cell voltage V(n) of the battery cell detected at time T(n) with a cell voltage V(n−1) of the battery cell detected at time T(n−1). If a difference dV between V(n−1) and V(n) is greater than a threshold $dV_{THR2}$, the battery management system 130 determines that an undesired condition has occurred in the battery cell in block 912. Otherwise, the flowchart 900 goes to block 914. In block 914, if the difference dV is greater than a threshold $dV_{THR1}$, the flowchart 900 goes to block 916. Otherwise, the flowchart 900 returns to block 902.

In block 916, the battery management system 130 calculates the factor MC(5) according to equation (9):

$$MC(5)=w5*NG(dV-dV_{THR1})/(dV_{THR2}-dV_{THR1}) \quad (9)$$

Then the flowchart 900 returns to block 902 to detect the voltage of the battery cell and the current flowing through the battery cell during a subsequent charging/discharging phase.

Figure 10:
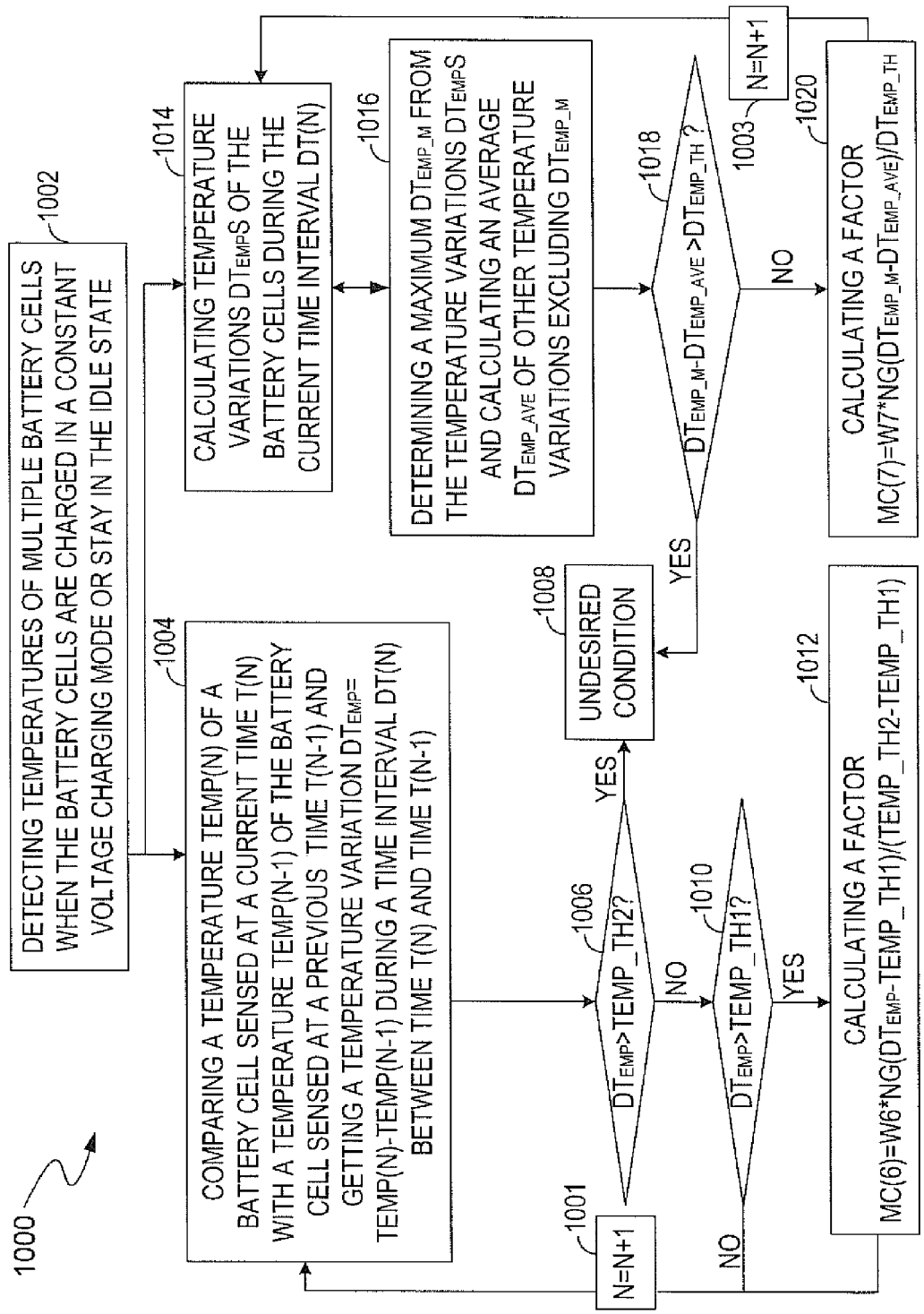
FIG. 10 illustrates a flowchart of a method for detecting the presence of an undesired condition in a battery pack, in accordance with one embodiment of the present invention.

FIG. 10 illustrates a flowchart 1000 of a method for detecting the presence of an undesired condition in a battery pack, in accordance with one embodiment of the present invention. In one embodiment, the battery pack includes multiple battery cells. FIG. 10 is described in combination with FIG. 1.

In block 1002, the battery management system 130 detects temperatures of the battery cells when the battery cells are charged in a constant voltage charging mode or stay in the idle state. In one embodiment, the battery management system 130 determines whether an undesired condition has occurred in a battery cell by comparing a temperature of the battery cell sensed at a current time with a temperature of the battery cell sensed at a previous time.

In block 1004, the battery management system 130 compares a temperature Temp(n) of the battery cell sensed at a current time T(n) with a temperature Temp(n−1) of the battery cell sensed at a previous time T(n−1), and calculates a temperature variation (difference) dTemp between Temp(n) and Temp(n−1) during a time interval dT(n) between the time T(n) and T(n−1).

In block 1006, if the temperature variation dTemp is greater than a threshold Temp_th2, the battery management system 130 determines that an undesired condition has occurred in the battery cell in block 1008. Otherwise, the flowchart 1000 goes to block 1010. In block 1010, if the temperature variation dTemp is greater than a threshold Temp_th1, the flowchart 1000 goes to block 1012. Otherwise, after n is incremented by 1 in block 1001, the flowchart 1000 returns to block 1004.

In block 1012, the battery management system 130 calculates the factor MC(6) according to equation (10):

$$MC(6)=w6*NG(D_{TEMP}-\text{Temp\_}th1)/(\text{Temp\_}th2-\text{Temp\_}th1). \quad (10)$$

After n is incremented by 1 in block 1001, the flowchart 1000 returns to block 1004 to compare a temperature Temp(n) of the battery cell sensed at time T(n) with the temperature Temp(n) of the battery cell sensed at time T(n−1).

In another embodiment, the battery management system 130 can detect whether an undesired condition has occurred in a battery cell by comparing a temperature variation of the battery cell with the temperature variations of other battery cells during a particular time interval.

More specifically, in block 1014, the battery management system 130 calculates temperature variations dTemps of the battery cells during a current time interval dT(n). In block 1016, the battery management system 130 identifies the maximum dTemp_M among the temperature variations dTemps and calculates an average dTemp_ave of other temperature variations excluding dTemp_M.

In block 1018, if a difference between the maximum dTemp_M and the average dTemp_ave is greater than a threshold dTemp_th, the battery management system 130 determines that an undesired condition has occurred in the battery cell that has the maximum dTemp_M in block 1008. Otherwise, the flowchart 1000 goes to block 1020.

In block 1020, the battery management system 130 calculates the factor MC(7) according to equation (11):

$$MC(7)=w7*NG(d\text{Temp\_}M-d\text{Temp\_ave})/d\text{Temp\_}th. \quad (11)$$

After n is incremented by 1 in block 1003, the flowchart 1000 returns to block 1014 to calculate temperature variations dTemps of the battery cells during a time interval dT(n).

Additionally, in one embodiment, the battery management system 130 can selectively add up all or some of the factors MC(1)-MC(7) calculated according to operations described in FIG. 6-10 and detect the presence of an undesired condition according to the summation of those factors.

Accordingly, embodiments in accordance with the present invention provide a battery management system for protecting multiple battery cells from fault conditions. The battery management system can include a detector for detecting multiple parameters of the battery cells including voltages, currents and temperatures of the battery cells and generating monitoring signals corresponding to the parameters of the battery cells. The battery management system can also include one or more multiplexers for transferring the monitoring signals to one or more converters for converting the monitoring signals to digital signals. The battery management system can also include a processor for storing the digital signals indicating the parameters of the battery cells from the converter into a memory and determining whether an undesired condition, e.g., a micro-shorting connection, has occurred in the battery cells according to variations in the monitored parameters of the batteries. By detecting the presence of an undesired condition, the battery management system can trigger protective actions to prevent the undesired condition from developing into a fault condition such as an over-voltage, over-current or over-temperature condition.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A battery management system for energy efficient operation including energy efficient charging and monitoring of a battery pack comprising a plurality of rechargeable battery cells, said battery management system comprising:
    a detector coupled to said battery cells and operable for generating first monitoring signals corresponding to cell voltages across said battery cells;
    a current sensor coupled to said battery pack and operable for generating a second monitoring signal corresponding to a current of said battery pack; and
    a processor coupled to said current sensor and said detector, and operable for calculating a rate of variation in each cell voltage of said cell voltages according to said first monitoring signals in a predetermined time interval and calculating variation in said current according to said second monitoring signal in said predetermined time interval, operable for comparing said rate of variation with a reference to generate first comparison information, operable for comparing said variation in said current with a preset threshold to generate second comparison information, and operable for determining whether an undesired condition is present according to said first and second comparison information.

2. The battery management system of claim 1, wherein if said variation in said current is less than said preset threshold, then said processor performs at least one operation of a first operation and a second operation;
    wherein in said first operation, said processor compares a first rate of decreasing of a voltage of a battery cell in a first time interval with a second rate of decreasing of said voltage of said battery cell of said battery cells in a second time interval, wherein said undesired condition is present if a difference between said first and second rates is greater than a first threshold; and
    wherein in said second operation, said processor compares a plurality of rates of decreasing of said cell voltages of said battery cells in a particular time interval to identify the maximum of said rates of decreasing in said particular time interval and compares said maximum with an average of other rates of decreasing in said particular time interval excluding said maximum, wherein said undesired condition is present if a difference between said maximum and said average is greater than a second threshold.

3. The battery management system of claim 1,
    wherein said processor compares said cell voltages for said battery cells in a charging phase to identify the first minimum of said cell voltages in said charging phase, and compares said first minimum with a first average of other cell voltages during said charging phase excluding said first minimum to obtain a first difference between said first average and said first minimum,
    wherein said processor compares said cell voltages for said battery cells in a discharging phase to identify the second minimum of said cell voltages in said discharging phase, and compares said second minimum with a second average of other cell voltages during said discharging phase excluding said second minimum to obtain a second difference between said second average and said second minimum,
    and wherein said undesired condition is present if said first difference and said second difference are greater than a threshold.

4. The battery management system of claim 1, wherein said processor compares a charging capacity of said battery pack with a discharging capacity of said battery pack, wherein said undesired condition is present if a difference between said charging capacity and said discharging capacity is greater than a threshold, and wherein said charging capacity represents an amount of charge that is charged to said battery pack in a charging phase, and said discharging capacity represents an amount of charge that is discharged from said battery pack in a discharging phase.

5. The battery management system of claim 1, wherein said processor compares a first current of said battery pack at a first time with a second current of said battery pack at a second time to obtain a first difference between said first and second currents, and compares a first cell voltage of a battery cell at said first time with a second cell voltage of said battery cell at said second time to obtain a second difference between said first and second cell voltages,
    and wherein said undesired condition is present if an absolute value of said first difference is less than a first threshold and said second difference is greater than a second threshold.

6. The battery management system of claim 1, wherein said processor performs at least one operation of a first operation and a second operation,
    wherein in said first operation, said processor compares temperatures of said battery cells at a first time with said temperatures of said battery cells at a second time, wherein said undesired condition is present if a difference between said temperatures of said battery cells at said first time and said temperatures of said battery cells at said second time is greater than a first threshold; and
    wherein in said second operation, said processor compares temperature variations in said temperatures for said battery cells in a particular time interval to identify the maximum of said temperature variations in said particular time interval, and compares said maximum with an average of other temperature variations during said particular time interval excluding said maximum, wherein said undesired condition is present if a difference between said maximum and said average is greater than a second threshold.

7. The battery management system of claim 1, wherein said processor calculates a plurality of factors according to combinations of said rate of variation in said each cell voltage of said cell voltages, temperatures of said battery cells, said variation in said current, and a comparison between a charging capacity of said battery pack and a discharging capacity of said battery pack, and wherein said undesired condition is present if a summation of said factors is greater than a threshold.

8. A battery management system for energy efficient operation including energy efficient charging and monitoring of a plurality of battery packs, wherein each battery pack comprises a plurality of rechargeable battery cells, said battery management system comprising:
a plurality of local battery management systems, wherein each of said local battery management systems is coupled to a respective battery pack, wherein each of said local battery management systems comprises a detector coupled to said battery cells operable for generating first monitoring signals corresponding to cell voltages across said battery cells;
a current sensor coupled to said battery packs in series and operable for generating a second monitoring signal corresponding to a current of said battery packs; and
a processor coupled to said current sensor and said detector, and operable for calculating a rate of variation in each cell voltage of said cell voltages according to said first monitoring signals in a predetermined time interval and calculating variation in said current according to said second monitoring signal in said predetermined time interval, operable for comparing said rate of variation with a reference to generate first comparison information, operable for comparing said variation in said current with a preset threshold to generate second comparison information, and operable for determining whether an undesired condition is present according to said first and second comparison information.

9. The battery management system of claim 8,
wherein if said variation in said current is less than said preset threshold, then said processor performs at least one operation of a first operation and a second operation;
wherein in said first operation, said processor compares a first rate of decreasing of a voltage of a battery cell in a first time interval with a second rate of decreasing of said voltage of said battery cell in a second time interval, wherein said undesired condition is present if a difference between said first and second rates is greater than a first threshold; and
wherein in said second operation, said processor compares a plurality of rates of decreasing of said cell voltages of said battery cells in a particular time interval to identify the maximum of said rates of decreasing in said particular time interval and compares said maximum with an average of other rates of decreasing in said particular time interval excluding said maximum, wherein said undesired condition is present if a difference between said maximum and said average is greater than a second threshold.

10. The battery management system of claim 8, wherein said processor compares said cell voltages for said battery cells in a charging phase to identify the first minimum of said cell voltages in said charging phase, and compares said first minimum with a first average of other cell voltages during said charging phase excluding said first minimum to obtain a first difference between said first average and said first minimum,
wherein said processor compares said cell voltages for said battery cells in a discharging phase to identify the second minimum of said cell voltages in said discharging phase, and compares said second minimum with a second average of other cell voltages during said discharging phase excluding said second minimum to obtain a second difference between said second average and said second minimum,
and wherein said undesired condition is present if said first difference and said second difference are greater than a threshold.

11. The battery management system of claim 8, wherein said processor compares a charging capacity of said battery packs with a discharging capacity of said battery packs, wherein said undesired condition is present if a difference between said charging capacity and said discharging capacity is greater than a threshold, and wherein said charging capacity represents an amount of charge that is charged to said battery packs in a charging phase, and said discharging capacity represents an amount of charge that is discharged from said battery packs in a discharging phase.

12. The battery management system of claim 8,
wherein said processor compares a first current of said battery packs at a first time with a second current of said battery packs at a second time to obtain a first difference between said first and second currents, and compares a first cell voltage of a battery cell at said first time with a second cell voltage of said battery cell at said second time to obtain a second difference between said first and second cell voltages,
and wherein said undesired condition is present if an absolute value of said first difference is less than a first threshold and said second difference is greater than a second threshold.

13. The battery management system of claim 8, wherein said processor performs at least one operation of a first operation and a second operation,
wherein in said first operation, said processor compares temperatures of said battery cells at a first time with said temperatures of said battery cells at a second time, wherein said undesired condition is present if a difference between said temperatures of said battery cells at said first time and said temperatures of said battery cells at said second time is greater than a first threshold; and
wherein in said second operation, said processor compares temperature variations in said temperatures for said battery cells in a particular time interval to identify the maximum of said temperature variations in said particular time interval and compares said maximum with an average of other temperature variations during said particular time interval excluding said maximum, wherein said undesired condition is present if a difference between said maximum and said average is greater than a second threshold.

14. The battery management system of claim 8, wherein said processor calculates a plurality of factors according to combinations of said rate of variation in said each cell voltage of said cell voltages, temperatures of said battery cells, said variation in said current, and a comparison between a charging capacity of said battery packs and a discharging capacity of said battery packs, and wherein said undesired condition is present if a summation of said factors is greater than a threshold.

15. A method for energy efficient operation including energy efficient charging and managing of a battery pack comprising a plurality of rechargeable battery cells, said method comprising:

detecting parameters of said battery cells using a detector and a current sensor, wherein said parameters comprise cell voltages and a current of said battery cells;

generating monitoring signals according to said parameters;

calculating a rate of variation in each cell voltage of said cell voltages in a predetermined time interval and variation in said current in said predetermined time interval according to said monitoring signals using a processor;

comparing said rate of variation with a reference to generate first comparison information;

comparing said variation in said current with a preset threshold to generate second comparison information; and determining whether an undesired condition is present in said battery cells according to said first and second comparison information.

16. The method of claim 15, further comprising:

performing at least one operation of a first operation and a second operation, wherein said first operation comprises comparing a first rate of decreasing of a voltage of a battery cell in a first time interval with a second rate of decreasing of said voltage of said battery cell in a second time interval, and determining that said undesired condition is present if a difference between said first and second rates is greater than a first threshold, and wherein said second operation comprises comparing a plurality of rates of decreasing of said cell voltages of said battery cells in a particular time interval to identify the maximum of said rates of decreasing in said particular time interval, comparing said maximum with an average of other rates of decreasing in said particular time interval excluding said maximum, and determining that said undesired condition is present if a difference between said maximum and said average is greater than a second threshold.

17. The method of claim 15, further comprising:

comparing said cell voltages for said battery cells in a charging phase to identify the first minimum of said cell voltages in said charging phase;

comparing said first minimum with a first average of other cell voltages during said charging phase excluding said first minimum to obtain a first difference between said first average and said first minimum;

comparing said cell voltages for said battery cells in a discharging phase to identify the second minimum of said cell voltages in said discharging phase;

comparing said second minimum with a second average of other cell voltages during said discharging phase excluding said second minimum to obtain a second difference between said second average and said second minimum; and determining that said undesired condition is present if said first difference and said second difference are greater than a threshold.

18. The method of claim 15, further comprising:

comparing a charging capacity of said battery pack with a discharging capacity of said battery pack; and determining that said undesired condition is present if a difference between said charging capacity and said discharging capacity is greater than a threshold, wherein said charging capacity represents an amount of charge that is charged to said battery pack in a charging phase, and said discharging capacity represents an amount of charge that is discharged from said battery pack in a discharging phase.

19. The method of claim 15, further comprising:

comparing a first current of said battery pack at a first time with a second current of said battery pack at a second time to obtain a first difference between said first and second currents;

comparing a first cell voltage of a battery cell at said first time with a second cell voltage of said battery cell at said second time to obtain a second difference between said first and second voltages; and determining that said undesired condition is present if an absolute value of said first difference is less than a first threshold and said second difference is greater than a second threshold.

20. The method of claim 15, further comprising:

performing at least one operation of a first operation and a second operation, wherein said first operation comprises comparing temperatures of said battery cells at a first time with said temperatures of said battery cells at a second time and determining that said undesired condition is present if a difference between said temperatures of said battery cells at said first time and said temperatures of said battery cells at said second time is greater than a first threshold, and wherein said second operation comprises comparing temperature variations in said temperatures for said battery cells in a particular time interval to identify the maximum of said temperature variations in said particular time interval, comparing said maximum with an average of other temperature variations during said particular time interval excluding said maximum, and determining that said undesired condition is present if a difference between said maximum and said average is greater than a second threshold.

* * * * *